United States Patent
Schmidt

(10) Patent No.: US 7,569,874 B2
(45) Date of Patent: Aug. 4, 2009

(54) DEVICE AND METHOD OF MANUFACTURE FOR A LOW NOISE JUNCTION FIELD EFFECT TRANSISTOR

(75) Inventor: Dominik J. Schmidt, Stanford, CA (US)

(73) Assignee: Intel Corporation, Santa Clara, CA (US)

(*) Notice: Subject to any disclaimer, the term of this patent is extended or adjusted under 35 U.S.C. 154(b) by 442 days.

(21) Appl. No.: 11/521,260

(22) Filed: Sep. 13, 2006

(65) Prior Publication Data

US 2008/0061325 A1 Mar. 13, 2008

(51) Int. Cl.
*H01L 29/80* (2006.01)
(52) U.S. Cl. ................ 257/270; 257/262; 257/E29.312
(58) Field of Classification Search ................ 257/270, 257/E29.312
See application file for complete search history.

(56) References Cited

U.S. PATENT DOCUMENTS 4,373,253 A 2/1983 Khadder et al.
6,005,267 A * 12/1999 Griffin et al. ................. 257/280
6,624,030 B2 9/2003 Chang et al.

FOREIGN PATENT DOCUMENTS

JP 10-256273 9/1998
JP 2006-196789 7/2006

OTHER PUBLICATIONS

PCT International Search Report and Written Opinion, International Application No. PCT/US2007/078438; International Filing Date, Sep. 13, 2007; mailing date, Jan. 7, 2008, (7 pp.).

* cited by examiner

*Primary Examiner*—Tu-Tu V Ho
(74) *Attorney, Agent, or Firm*—Blakely, Sokoloff, Taylor & Zafman LLP

(57) ABSTRACT

A microelectronic product and the method for manufacturing the product are provided. A source and drain are spaced from one another in a first direction and are connected to opposing ends of a channel to provide a set voltage. First and second gates are spaced from one another in a second direction surrounding a portion of the channel to allow for application and removal of a gate voltage. Application of the gate voltage repels majority carriers in the channel to reduce the current that conducts between the source and drain.

12 Claims, 6 Drawing Sheets

DEVICE AND METHOD OF MANUFACTURE FOR A LOW NOISE JUNCTION FIELD EFFECT TRANSISTOR

BACKGROUND OF THE INVENTION

1). Field of the Invention

Embodiments of this invention relate to a junction field effect transistor (JFET) that provides greater control over current flow through the channel.

2). Discussion of Related Art

Semiconductor devices can be manufactured in the form of an integrated circuit or single device on a semiconductor substrate. A transistor is a type of semiconductor device that can be used for switching, amplification, signal modulation, and many other functions.

A type of transistor, called the field effect transistor (FET), relies on the application of a voltage to a gate in order to control the conductivity or current flow of a "channel."

The channel region of any FET can be doped with either n-type implants or p-type implants, creating an n-type device or p-type device. Various types of FETs use different types of insulation between the channel and the gate.

Perhaps the most common FET is a metal oxide semiconductor field effect transistor (MOSFET) that uses an insulator between the channel and the gate, such as $SiO_2$ (oxide).

Another type of FET, known as a JFET, utilizes a p-n junction as the gate. A conventional three-terminal JFET allows current to flow from a source to a drain while controlling the current flow with two gates.

Without a gate voltage, the charge carriers flow in the channel region between the source and drain terminals and are "normally on" unless a gate voltage is applied. When the gate voltage is applied, a depletion region is created by pushing mobile carriers away from the channel and "pinching off" the channel.

Gate voltages can be varied to cause the JFET to act as a switch or to modulate the flow of current by affecting the cross-sectional area of the channel and the channel resistance. The type of JFET application will determine whether the JFET is most desirable as a switch or modulator.

In one example, JFETs can be useful in designing radio transceivers using direct conversion. Essentially, a radio frequency signal and local oscillator signal are fed into a mixer at the same carrier frequency. The signals are subtracted from one another, resulting in a low-frequency base-band output signal.

One of the problems with direct conversion is that the mixer must operate at very high frequencies while providing some gain, which introduces noise that makes signal processing difficult.

Mixer transistors should ideally be small in order to support frequencies in excess of 6 GHz. However, the area of the device is inversely proportional to the flicker noise created. At lower frequencies, the dominant flicker noise source in a MOSFET transistor is due to the interaction of the mobile charges with the silicon-oxide interface and the dopant ions in the channel.

In contrast, JFETs mitigate flicker noise, because the conduction occurs via the p-n junction, in the bulk, rather than near the surface of the oxide interface. However, a problem still exists with manufacturing JFETs with standard complementary metal oxide semi-conductor (CMOS) procedures. Manufacturing an effective JFET with standard CMOS procedures would have traditionally required carefully tailored implants to achieve the correct channel depth, which further requires additional masking, which increases the cost of the product. Many JFETs use a buried gate within the substrate material to act as another means to control the channel flow. If a buried gate is not used, the resulting JFET would inefficiently require up to several hundred volts to "pinch off" the channel.

BRIEF DESCRIPTION OF THE DRAWINGS

The invention is described by way of examples with reference to the accompanying drawings, wherein.

DETAILED DESCRIPTION OF THE INVENTION

FIGS. 1 to 4 of the accompanying drawings illustrate a JFET 20, according to one embodiment of the invention, including a source 22, a drain 24, a channel 26, and first and second gates 30 and 32.

The fabrication of the junction field effect transistor is first described with respect to FIGS. 5 to 9, whereafter its functioning is described.

Figure 5:
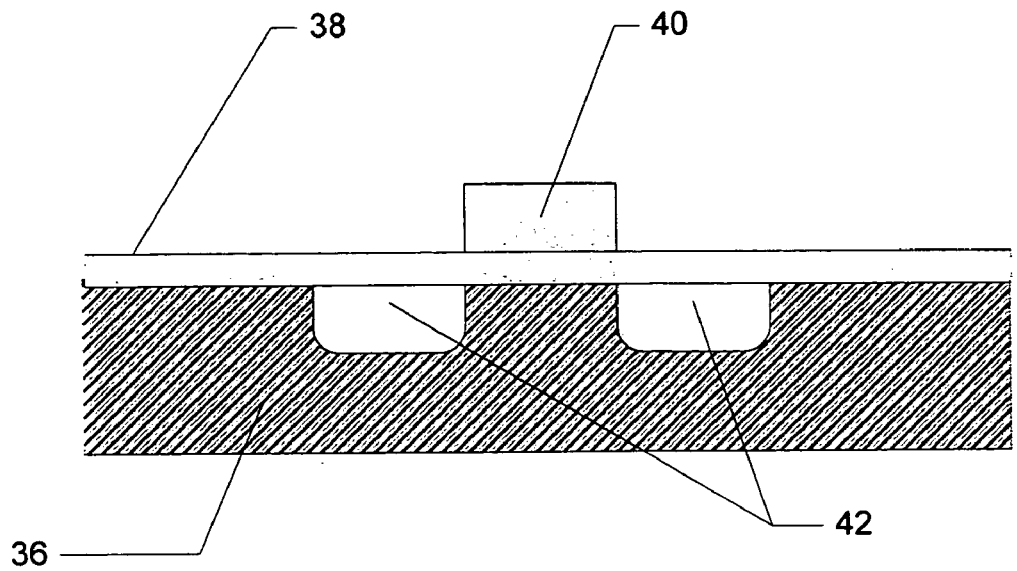
FIG. 5 is a cross-sectional front view similar to FIG. 2, illustrating a stage in a manufacturing process wherein an insulator material is applied to a substrate.

FIG. 5 shows a p-substrate 36 of a wafer. The substrate material can be gallium-arsenide, silicon, germanium, silicon carbide, or other known semiconductor substrate materials. The substrate material is then p-doped to form a p-substrate 36 which will later act as a second gate 32 and third gate 34.

A thin epitaxial layer of insulator material 38, such as oxide, is grown on top of the p-substrate 36 and an electrode material 40 is applied on top of the insulator material 38. An n-type dopant is then implanted into unmasked portions of the p-substrate 36, resulting in n-type regions 42. The n-type dopant can be phosphorous, arsenic, antimony, or any other known doping agent that can produce an abundance of mobile electrons in the material to which it is applied.

Figure 6:
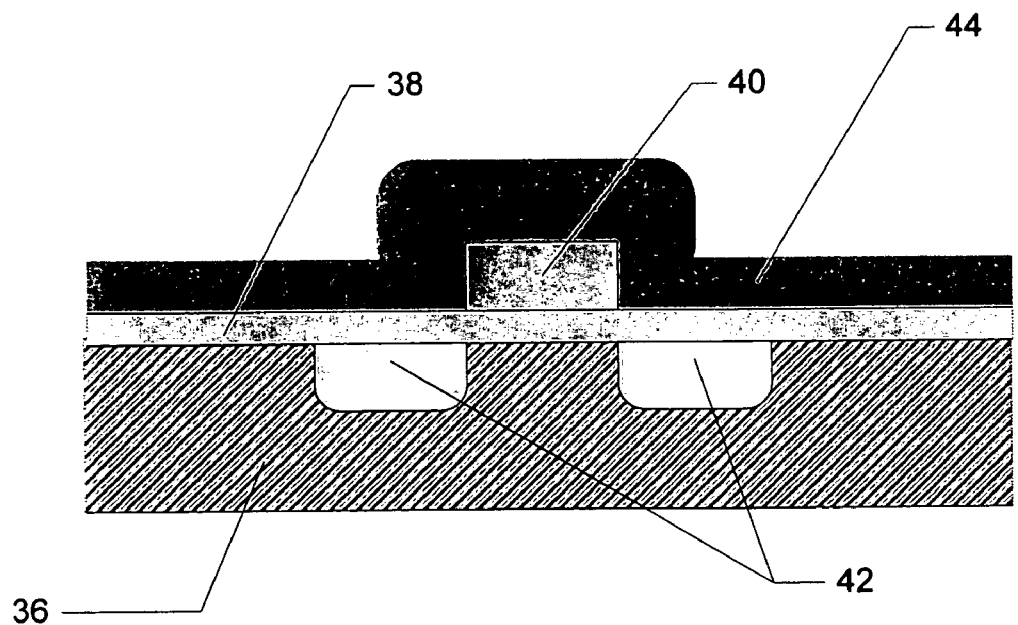
FIG. 6 is a view similar to FIG. 5, illustrating a stage in a manufacturing process wherein a conformal layer is applied to a substrate.

As shown in FIG. 6, after the n-type regions 42 have been created, an oxide conformal layer 44 is applied over the insulator material 38, electrode material 40, and n-type regions 42. Conformal layer 44 material can be chosen according to the type of etching process used.

Figure 7:
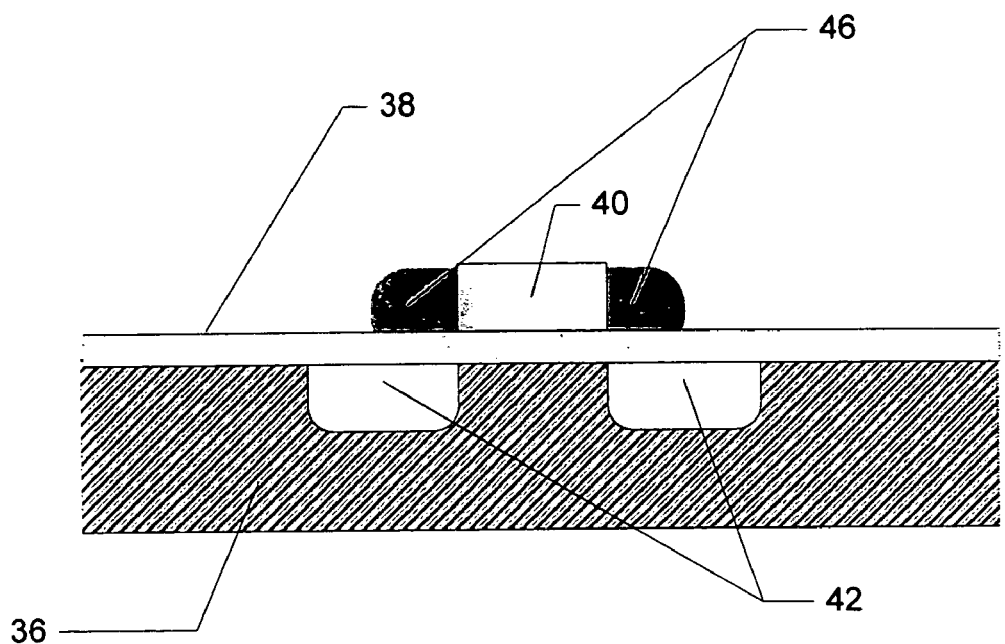
FIG. 7 is a view similar to FIG. 6, illustrating a stage in a manufacturing process wherein the conformal layer is etched.

In FIG. 7, the conformal layer 44 is anisotropically etched back by the etching process, forming spacers 46 extending over a portion of the n-type region 42. The etching process can be plasma etching or any known anisotropic etching process.

Figure 8:
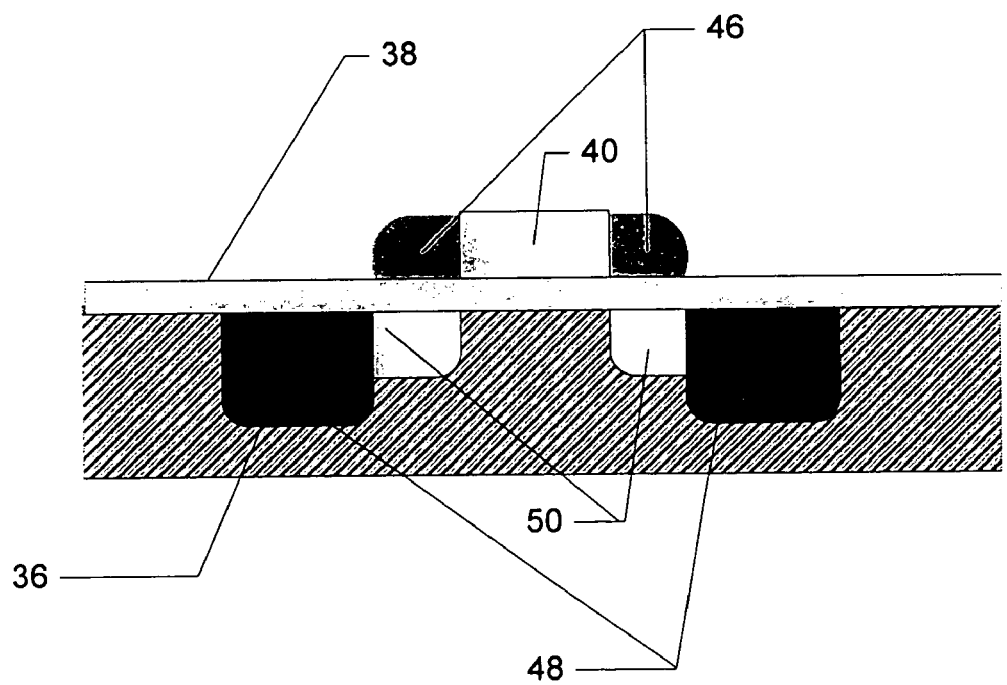
FIG. 8 is a view similar to FIG. 7, illustrating a stage in a manufacturing process wherein implants are inserted into the substrate.

As shown in FIG. 8, P-implants 48 are then implanted next to the spacers 46 by any known method of p-type doping with a p-type doping agent, such as boron. The spacers 46, resulting from the anisotropic etching process, are positioned so that the P-implants 48 are prevented from completely covering the n-type doped regions 42. Therefore, as shown in FIG. 8, small N-tip implant channels 50 are created under the spacers 46 after P-implants 48 are inserted. Also shown in FIG. 8, the N-tip channels 50 are located directly under the spacers 46 and do not yet extend under the electrode material 40. The P-implants 48 are spaced away from the electrode material 40 by the N-tip channels 50.

Figure 9:
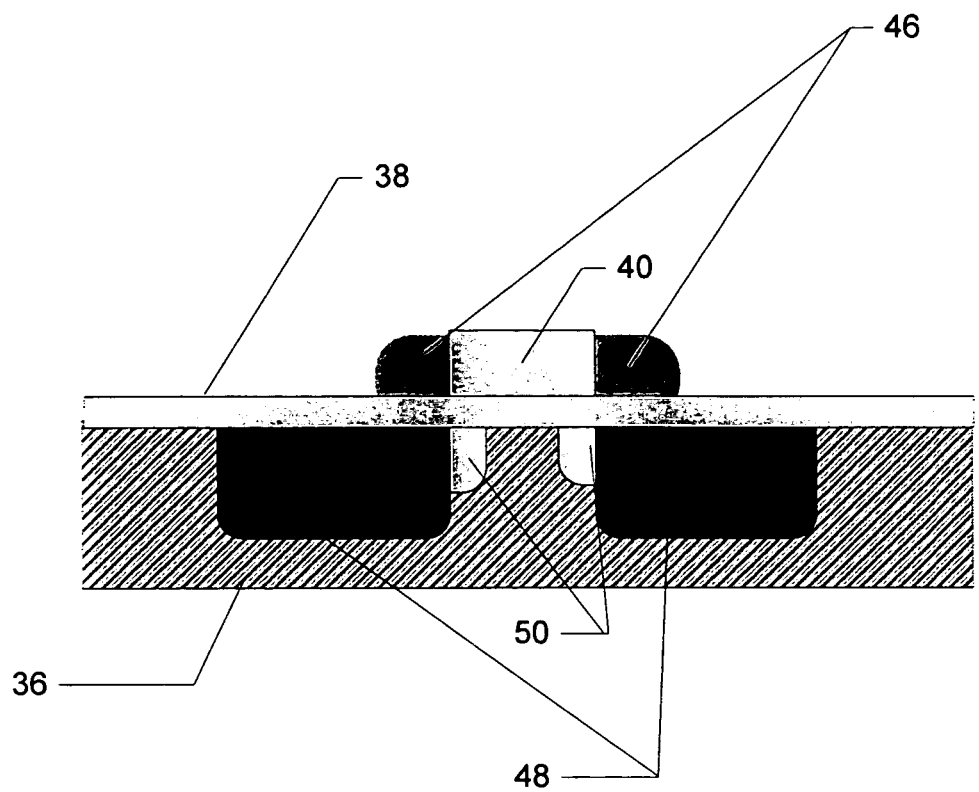
FIG. 9 is a view similar to FIG. 8, illustrating a stage in a manufacturing process wherein the device has been annealed.

As shown in FIG. 9, the device assembly is then annealed, causing the activation and diffusion of the P-implants 48 and N-tip channels 50. The high-temperature annealing process causes the N-tip channels 50 and P-implants 48 to diffuse both vertically and horizontally, which results in a final N-tip channel 50 location being underneath the electrode material 40. The P-implants 48 also diffuse to a position where a P-implant 48 edge is aligned with an edge of the electrode material 40. In the final position, the P-implant 48 is no longer spaced away from the electrode material 40 by the N-tip channel 50. The p-substrate 36 continues to surround the N-tip channel 50 on sides that do not face the P-implant 48 or oxide interface 38.

After diffusion, the P-implant 48 effectively acts as a first gate 30, and portions of the p-substrate 36 act as a second gate 32 and a third gate 34. Furthermore, the electrode material 40 effectively acts as a fourth gate 52. Activation of the doped regions 48 and 50 also occurs in the annealing process by repairing any lattice damage that may have occurred during the implantation process. Furthermore, the N-tip channel 50 becomes an activated N-tip channel 26.

Referring again to FIGS. 2, 3, and 4, a second insulator material is then created in the z-direction, forming a second insulator layer 54 surrounding the fourth gate 52. A contact material 56, which can be tungsten or any known contact material, is applied on top of the fourth gate 52 surrounded by a third insulator layer 60 created on top of the second insulator layer 54. A final conductor layer 62 is applied from a metalizing process to the top of the contact 56 and third insulator layer 60. The final conductor layer 62 is copper or any other acceptable conducting material.

Figure 1:
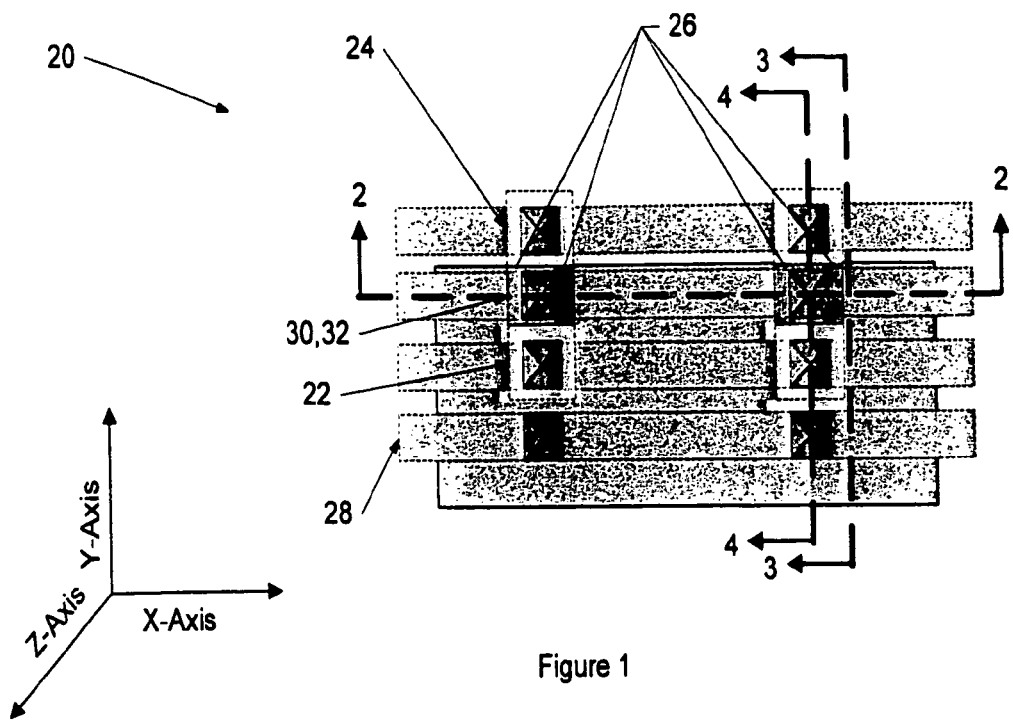
FIG. 1 is a top view of a substrate containing multiple junction field effect transistors, according to one embodiment of the invention.

As shown in FIG. 1, the source 22 and the drain 24 are generally spaced apart from one another in the y-direction and are N+ doped. The substrate 36 extends primarily in the x- and y-directions. A P+ depletor electrode 28 is spaced from the source 22 and drain 24 in the y-direction connected to apply a gate voltage to the first gate 30, second gate 32, third gate 34, and fourth gate 52.

Figure 4:
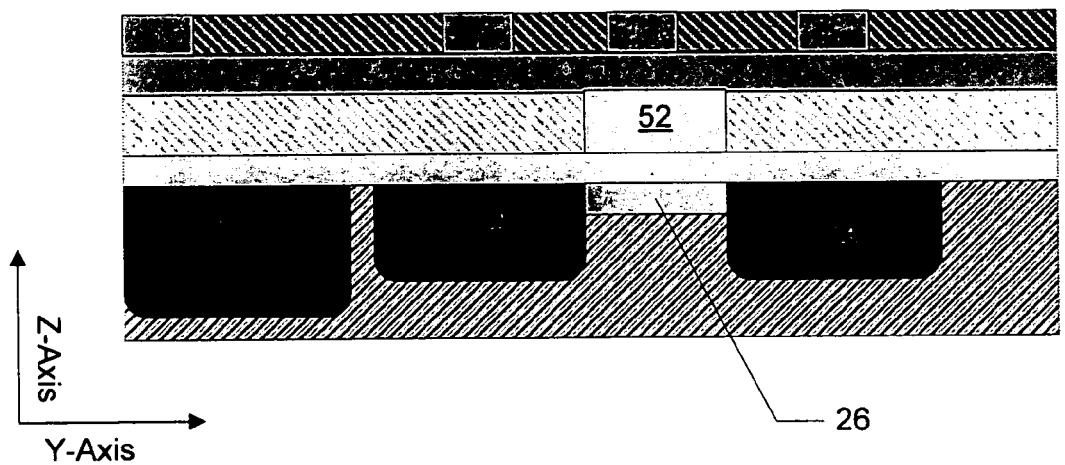
FIG. 4 is a cross-sectional side view on lines 4-4 of FIG. 1.

Referring to FIG. 4, the N+ doped source 22 and drain 24 regions are disposed on opposing sides of the N-tip channel 26. The source 22 and drain 24 are arranged in contact with the N-tip channel 26. The arrangement allows current to flow between the source 22 and drain 24 via contact with the N-tip channel 26.

Figure 3:
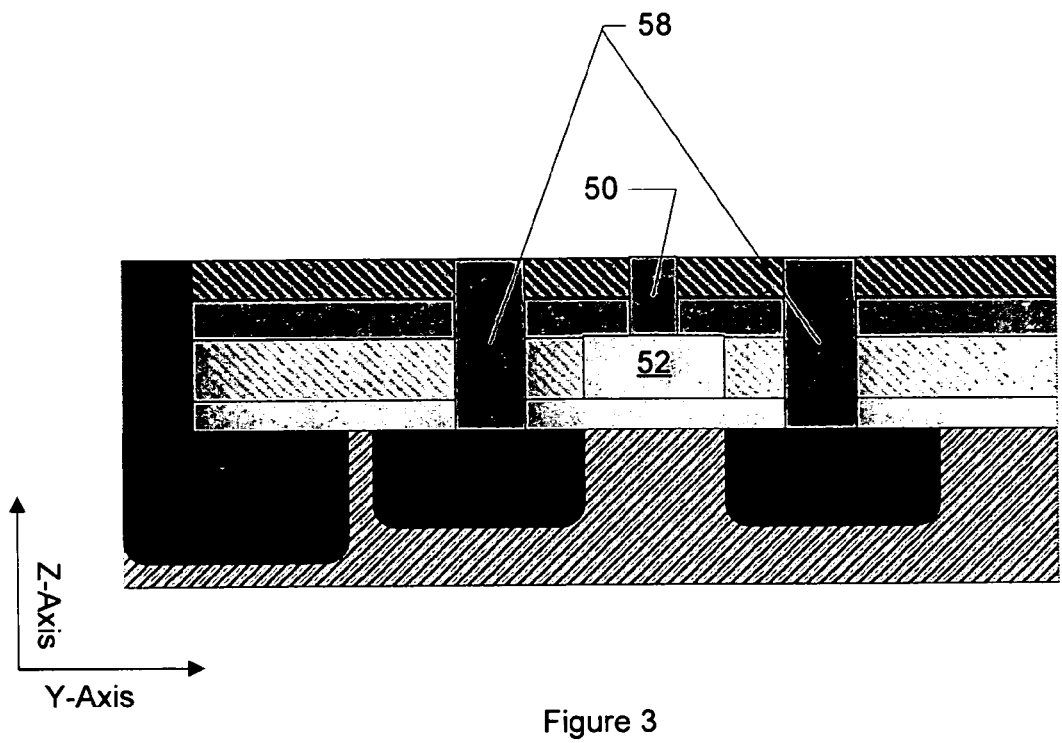
FIG. 3 is a cross-sectional side view taken on 3-3 of FIG. 1.

As shown in FIG. 3, the source 22 and drain 24 can have a voltage applied through a contact material 58, which can be selected from any known contact material such as tungsten.

Figure 2:
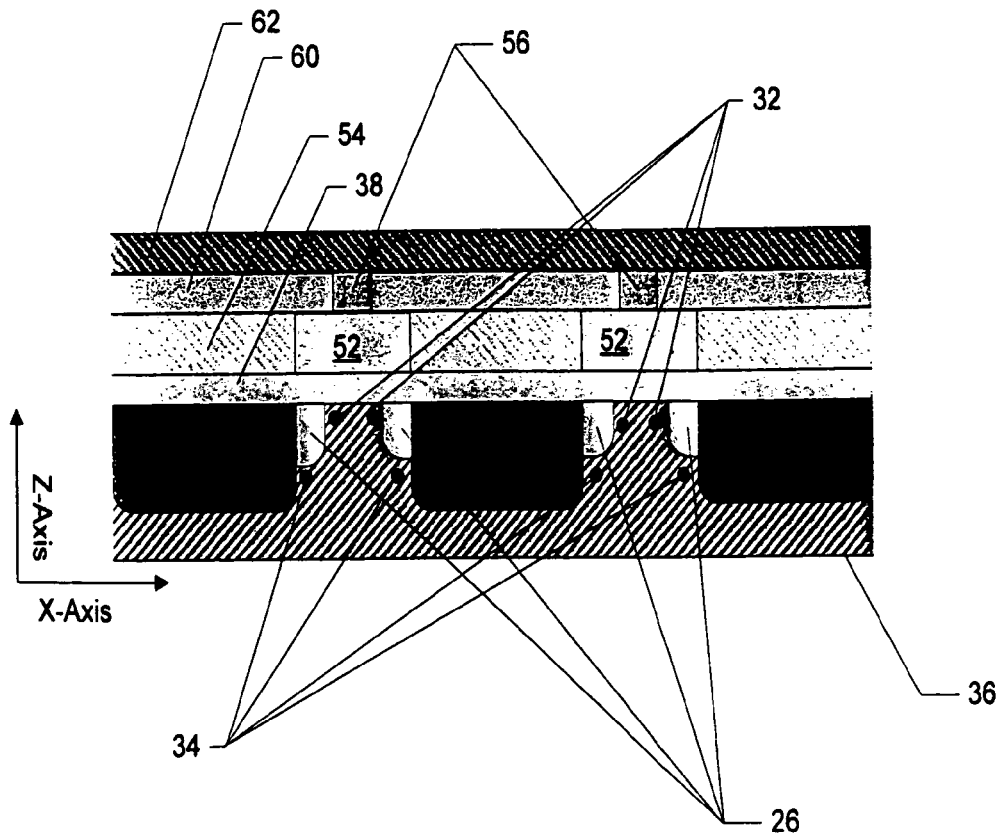
FIG. 2 is a cross-sectional front view taken on 2-2 of FIG. 1.

As shown in FIG. 2, the fourth gate 52 is positioned above the N-tip channel 26 and the first gate 30 is positioned to the side of the N-tip channel 26, while the p-substrate 36 surrounds the N-tip channel 26 acting as a second gate 32 and third gate 34. The first gate 30 and second gate 32 are spaced apart in the x-direction.

As further shown in FIGS. 1 and 2, four N-tip channels 26 extend in the y-direction and are spaced apart from one another in the x-direction. It should be noted that the device can be created with one or more N-tip channels 26, depending upon the application and current flow demands.

FIG. 2 shows a total of three first gates 30, four N-tip channels 26, and two fourth gates 52. Referring to FIG. 2, two N-tip channels 26 are located under a fourth gate 52 while being spaced apart by the p-substrate 36. Two N-tip channels 26 and a portion of p-substrate 36 are located between two first gates 30.

In use, referring to FIGS. 1 to 4, a set voltage is applied through the contact material 58 to the source 22 and drain 24, causing a current to flow through the N-tip channel 26. The N-tip channel 26 is surrounded by a first gate 30 and a p-substrate material 36 which acts as a second gate 32 and third gate 34. The fourth gate 52 is also disposed above the N-tip channel 26 in the z-direction.

Referring to FIG. 1, when a negative gate voltage is then applied through the P+ depletor 28, the first gate 30, second gate 32, third gate 34, and fourth gate 52 create a reverse bias region within the N-tip channel 26, causing the N-tip channel 26 to be "pinched off" and completely deplete with no conduction. The gates create a negative bias region by repelling or pushing holes away in the N-tip channel 26, therefore stopping the flow of electrons. The majority carriers in this embodiment are holes, but the majority carriers can also be electrons in an electron-based device.

The first gate 30 and fourth gate 52 are doped P+ in order to more easily make a contact through the material. When the gate voltage is applied to the first gate 30, it also causes the p-substrate 36 material to act as a second 32 and third 34 gate. Surrounding the N-tip channel 26 with gates allows for even more effective restriction of the current flow through the N-tip channel 26. When the gate voltage is removed, the current will resume flow between the source 22 and drain 24.

The typical metal oxide semiconductor field effect transistor having an N+ source and drain (NMOS) creates a channel just under an oxide layer when a positive gate voltage is applied. The typical NMOS device has higher flicker noise or 1/f (1/frequency) noise because the electrons are trapped along the silicon-oxide interface when flowing between the source and drain.

The evolution of the JFET allowed for lower 1/f flicker noise than the NMOS because there is no oxide interface to trap electrons, since conduction occurs via the bulk rather than the surface of the substrate. However, common JFET arrangements require carefully tailored buried implants to achieve the correct channel depth and control, which requires additional masking and manufacturing. Increased manufacturing steps result in increased cost and complexity of the product. If a buried gate was not used in a typical JFET, the resulting JFET would ineffectively require several hundred volts to turn off a deep channel.

A main advantage of the embodiment in FIGS. 1 to 4 is that it uses existing standard complementary metal-oxide semiconductor manufacturing processes while reducing 1/f noise by relying on N-tip channels 26 without a buried gate. Even though there is an oxide or insulator layer 38 near the N-tip channel 26, the 1/f noise in the embodiment in FIGS. 1 to 4 is significantly reduced.

The JFET 20 of FIG. 1 is thus a microelectronic product that has a substrate 36 extending primarily in x- and y-directions, a channel 26 formed on the substrate 36, a source and drain 22 and 24 spaced from one another in the y-direction and connected to opposing sides of the channel 26 to provide a set voltage over the channel 26, and first and second gate portions 30 and 32 spaced from one another in the x-direction and located on opposing sides of the channel 26 to allow for application and removal of a gate voltage over the gate portions, application of the gate voltage repelling majority carriers in the x-direction to reduce current that conducts between the source and the drain 22 and 24.

The substrate 36 includes part of a wafer and JFET 20 further has a p-doped layer on the wafer, the channel 26 being an n-doped channel on the p-doped layer, and a p+ doped implant next to the channel 26, the first 30 and second 32 gate portions being the p+ doped implant and a portion of the p-doped layer respectively. The p-doped layer forms a third gate 34 portion below the channel 26.

The JFET 20 also has an electrode in the form of the gate 52 above the p-doped layer, the channel 26 being a tip implant below the electrode.

As should be evident from the description of FIGS. 1 to 9, a method of making a junction field effect transistor is described. Specifically, the channel 26, the source 22, the drain 24, and the first and second gate portions 30 and 32 are formed on a substrate 24 extending primarily in x- and y-directions. The source and the drain 22 and 24 are spaced from one another in the y-direction and connected to opposing sides of the channel 26 to provide a set voltage over the channel 26. The first and second gate portions 30 and 32 are spaced from one another in the x-direction and located on opposing sides of the channel 26, such that application and removal of a gate voltage over the gate portions respectively reduces and increases current that conducts between the source 22 and the drain 24.

It should also be evident that a method of controlling current flow is described. A set voltage is applied over the source 22 and the drain 24 connected over the channel 26 formed on the substrate 24 extending in x- and y-directions. A gate voltage is alternately applied and removed over the first and second gate portions 30 and 32 spaced from one another in the x-direction, application of the gate voltage repelling majority carriers in the x-direction to reduce current flowing through the channel 26.

The JFET 20 formed by the structure in FIGS. 1 to 9 consists of a long channel 26 of semiconductor material. This material is doped so that it contains an abundance of positive charge carriers (p-type), or of negative charge carriers (n-type). There is a contact at each end; these are the source and drain 22 and 24. The third control terminal, the gate, surrounds the channel 26, and is doped opposite to the doping-type of the channel 26.

With no gate voltage, current flows easily when a voltage is applied between the source 22 and drain 24. The current flow is modulated by applying a voltage between gate and source terminals. The polarity of the gate voltage is such that it puts the p-n junction between the gate and channel in reverse bias, increasing the width of the depletion region in the junction. As the current-carrying channel shrinks with increasing gate voltage, the current from source to drain also shrinks. In this way, the gate controls the conductance of the channel 26, just like in a MOSFET. Unlike most MOSFETs, JFETs are always depletion-mode devices—they're "on" unless a gate voltage is applied.

The JFET gate presents a small current load which is the reverse leakage of the gate-to-channel junction. The MOSFET has the advantage of extremely low gate current (measured in picoamps) because of the insulating oxide between the gate and channel. However, compared to the base current of a bipolar junction transistor the JFET gate current is much lower, and the JFET has higher transconductance than the MOSFET. Therefore JFETs are used to advantage in some low-noise, high input-impedance op-amps and sometimes used in switching applications.

Current in N-JFET due to a small voltage $V_{DS}$ is given by:

$$I_{DS} = (2a)WQD_D\mu\frac{V_{DS}}{L}$$

where
2a=channel thickness
W=width
L=length
Q=electronic charge=$1.6\times10^{-19}$ C
$\mu$=electron mobility
In saturation region, $$I_{DS} = I_{DSS}\left[1 - \frac{V_{GS}}{V_P}\right]^2$$

In linear region, $$I_D = \frac{(2a)WQN_D\mu_D}{L}\left[1 - \left(\frac{V_{GS}}{V_P}\right)^{1/2}\right]V_{DS}$$

Figure 10:
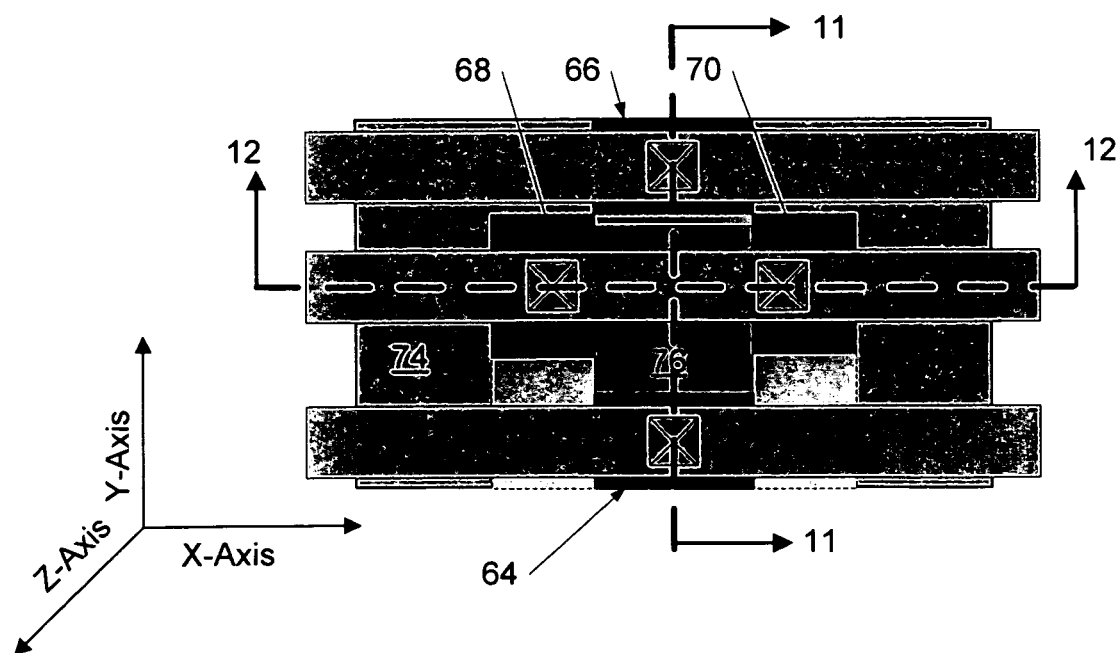
FIG. 10 is a top view of a substrate containing a junction field effect transistor according to another embodiment of the invention.
Figure 11:
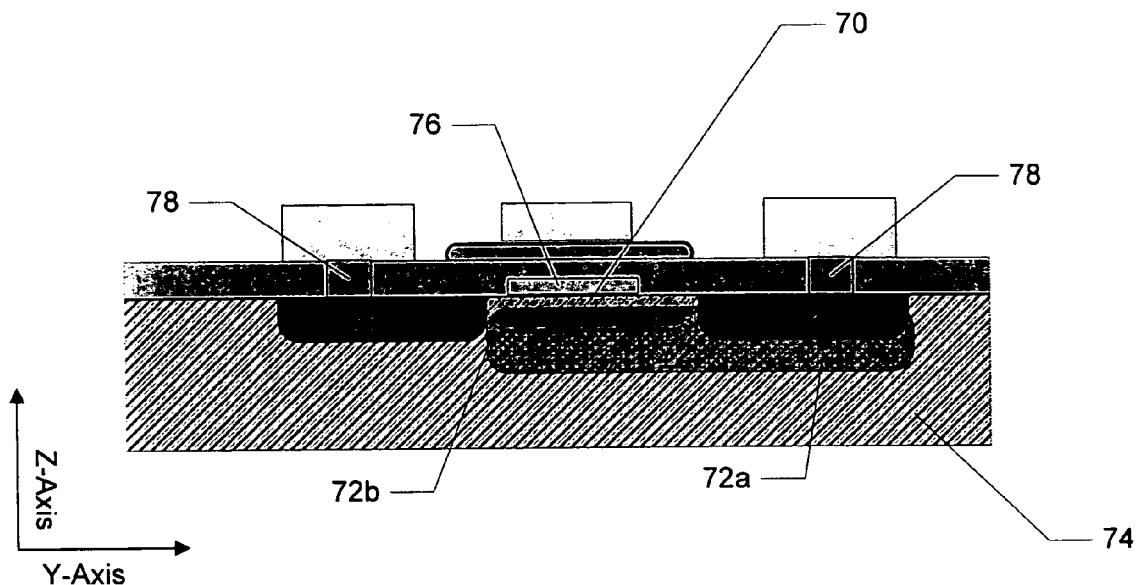
FIG. 11 is a cross-sectional side view on 11-11 of FIG. 10.
Figure 12:
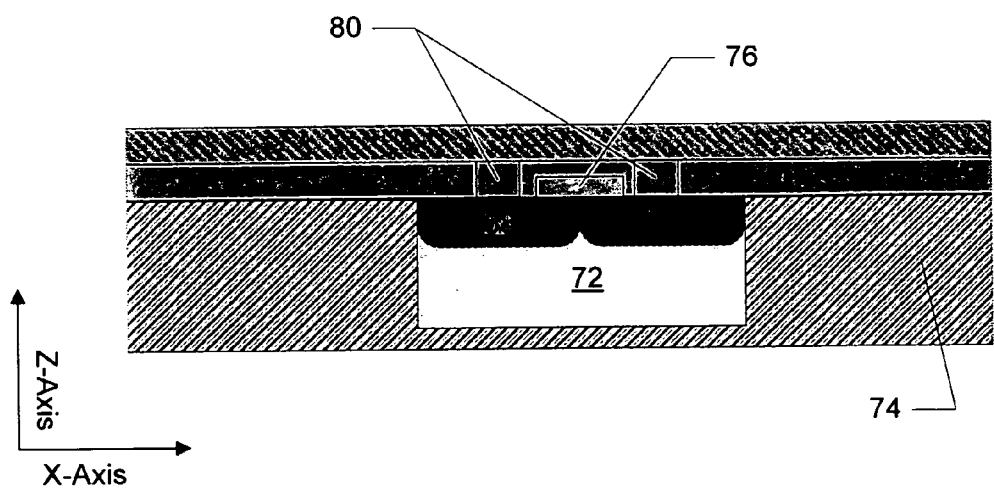
FIG. 12 is a cross-sectional front view on 12-12 of FIG. 10.

A second embodiment shown in FIGS. 10 to 12 illustrates another alternate embodiment having a source 64, a drain 66, a n-well channel 72, and first gate 68 and second gate 70. As shown in FIG. 10, the source 64 and drain 66 are spaced in the y-direction, while the first gate 68 and second gate 70 are generally spaced in the x-direction from one another within a p-substrate 74. The n-well channel 72 connects the source 64 and drain 66 to allow current to flow between them when a voltage is applied through contact material 78.

As shown in FIG. 12, the first gate 68 and second gate 70 can have a voltage applied to them through gate contact material 80. As shown in FIG. 11, the n-well channel 72 has a source end 72a and a drain end 72b.

A third gate 76 extends in primarily x- and y-directions and is located on top of first gate 68 and second gate 70, and the n-well channel 72. The third gate 76 can be chosen from any known effective conductor or gate material such as polysilicon.

As shown in FIGS. 11 and 12, the n-well channel 72 extends under the first gate 68 and second gate 70 to connect the source 64 and drain 66. Referring to FIG. 12 specifically, the first gate 68 and second gate 70 are aligned in the same plane above the n-well channel 72.

Referring specifically to FIG. 11, the source end 72a of the n-well channel 72 is in full contact with the source 64 N+ region; however, the drain end 72b of the n-well channel 72 is only slightly touching the drain 66 N+ region. Moreover, referring to FIG. 10, the first gate 68 and second gate 70 are offset slightly in the y-direction toward the drain 66.

The n-well channel can have an impurity concentration of about $1\times10^{18}$ cm$^{-3}$, and source and drain concentrations can be about $1\times10^{20}$ cm$^{-3}$.

The first gate 68 and second gate 70 and the source 64 and drain 66 can be manufactured to a depth of about 0.3 μm from the top of the p-substrate 36. The n-well 72 can be manufactured to a depth of about 1.7 μm.

In use, a set voltage is applied between the source 64 and drain 66 through contact material 78 in order to allow a current to flow between the source 64 and drain 66 via the n-well channel 72. However, when a negative gate voltage is applied through gate contact material 80 to the first gate 68 and second gate 70, a reverse bias region is created by pushing holes away in the n-well channel 72 and the n-well channel ends 72a and 72b. As shown in FIG. 12, the reverse bias region will pinch off the n-well channel 72 in the z-direction. Also shown in FIG. 12, a negative voltage on the third gate 76 will invert the n-well channel 72, thereby causing further depletion. Typically, pinching the current flow in the z-direction alone may still be ineffective in preventing bulk current leakage that occurs at the bottom of the n-well channel 72.

However, referring to FIG. 11, the n-well channel 72 is only slightly touching the drain 66 N+ region at the drain end 72b. Moreover, the first gate 68 and second gate 70 are laterally disposed on either side of the n-well channel drain end 72b, and offset in the y-direction toward the drain 66. When a gate voltage is applied to all the gates 68, 70, and 76, a gate voltage not only pinches in the z-direction but also in the x- and y-directions as well. The pinching at the n-well channel drain end 72b causes the drain 66 to be isolated and ceases all current flow.

The combination of providing a small drain 66 contact area with the n-well drain end 72b and specifically placing first gate 68 and second gate 70 near the n-well drain end 72b results in drain isolation. Therefore, bulk leakage through the bottom of the n-well channel 72 is not a concern, since the drain 66 is pinched off from the source 64. In this arrangement, a large amount of voltage is not needed to pinch off the n-well channel 72. The n-well channel 72 is sufficiently thin so that it can be pinched off with just a few volts.

As mentioned before, NMOS arrangements have a higher 1/f noise because of the flow of electrons along an oxide-silicon interface. Also, JFET arrangements without a buried gate may require several hundred volts to deplete a deep channel.

The main advantage of the embodiment of FIGS. 10-12 is that the device is able to eliminate any 1/f noise resulting from an oxide-silicon interface, while shutting off current flow without the use of a buried gate and without the use of several hundred volts. Furthermore, the unique location of the first gate 68, second gate 70, and n-well channel 72 enables the device to deplete a deep channel without the use of a buried gate, while also eliminating bulk leakage that might occur through the bottom of the n-well channel by isolating the drain 66.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A microelectronic product comprising:
   a substrate extending primarily in x- and y-directions;
   a channel formed on the substrate;
   a source and drain spaced from one another in the y-direction and connected to opposing sides of the channel to provide a set voltage over the channel; and
   first and second gate portions spaced from one another in the x-direction and located on opposing sides of the channel to allow for application and removal of a gate voltage over the gate portions, application of the gate voltage repelling majority carriers in the x-direction to reduce current that conducts between the source and the drain.

2. A microelectronic product as claimed in claim 1, further comprising a p-doped layer on the substrate, the channel being an n-doped channel on the p-doped layer, and a p+ doped implant next to the channel, the first and second gate portions being the p+ doped implant and a portion of the p-doped layer respectively.

3. A microelectronic product as claimed in claim 2, further comprising an electrode above the p-doped layer, the channel being a tip implant below the electrode.

4. A microelectronic product as claimed in claim 2, wherein the p-doped layer forms a third gate portion below the channel.

5. A microelectronic product as claimed in claim 1, further comprising an n-well, the channel being an upper portion of the n-welt wherein current leakage below the channel between the source and the drain is prevented due to the first and second gate portions repelling majority carriers in the n-well below the channel.

6. A microelectronic product as claimed in claim 5, further comprising a third gate position above the channel and repelling majority carriers in a z-direction.

7. A microelectronic product as claimed in claim 1, wherein the source and the drain are n+ regions.

8. A microelectronic product as claimed in claim 7, wherein the channel is n-doped.

9. A microelectronic product as claimed in claim 8, wherein the first and second gates are p+ regions.

10. A method of controlling current flow, comprising:
    applying a set voltage over a source and a drain connected over a channel formed on a substrate extending in x- and y-directions; and
    alternately applying and removing a gate voltage over first and second gate portions spaced from one another in the x-direction. application of the gate voltage repelling majority carriers in the x-direction to reduce current flowing through the channel.

11. The method of controlling current flow as claimed in claim 10, further comprising applying the gate voltage to a gate portion between the substrate and the channel to repel majority carriers in a z-direction.

12. The method of controlling current flow as claimed in claim 11, further comprising applying the gate voltage to a gate portion on a side of the channel opposing the substrate to repel majority carriers in a z-direction.

* * * * *